(12) United States Patent
Lin et al.

(10) Patent No.: US 10,774,415 B2
(45) Date of Patent: Sep. 15, 2020

(54) MASK AND ASSEMBLING METHOD THEREOF

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Zhiming Lin, Beijing (CN); Zhen Wang, Beijing (CN); Jian Zhang, Beijing (CN)

(73) Assignees: BOE TECHNOLOGY GROUP CO., LTD., Beijing (CN); ORDOS YUANSHENG OPTOELECTRONICS CO., LTD., Ordors, Inner Mongolia (CN)

(*) Notice: Subject to any disclaimer, the term of this patent is extended or adjusted under 35 U.S.C. 154(b) by 45 days.

(21) Appl. No.: 15/744,958

(22) PCT Filed: Jul. 3, 2017

(86) PCT No.: PCT/CN2017/091397
§ 371 (c)(1),
(2) Date: Jan. 15, 2018

(87) PCT Pub. No.: WO2018/103322
PCT Pub. Date: Jun. 14, 2018

(65) Prior Publication Data
US 2019/0010599 A1    Jan. 10, 2019

(30) Foreign Application Priority Data

Dec. 5, 2016   (CN) .......................... 2016 1 1104015

(51) Int. Cl.
*C23C 14/04*   (2006.01)
*C23C 14/24*   (2006.01)
(Continued)

(52) U.S. Cl.
CPC .......... *C23C 14/042* (2013.01); *B05C 21/005* (2013.01); *C23C 14/12* (2013.01);
(Continued)

(58) Field of Classification Search
None
See application file for complete search history.

(56) References Cited

U.S. PATENT DOCUMENTS

| | | | | |
|---|---|---|---|---|
| 3,323,490 A * | 6/1967 | McGilliard | ........... | C23C 14/042 118/504 |
| 2013/0199443 A1* | 8/2013 | Kim | ........................ | B05B 12/20 118/504 |
| 2016/0122860 A1* | 5/2016 | Kim | ...................... | C23C 14/042 118/505 |

FOREIGN PATENT DOCUMENTS

| CN | 103938153 A | 7/2014 |
|---|---|---|
| CN | 105039907 A | 11/2015 |

(Continued)

OTHER PUBLICATIONS

International Search Report and Written Opinion dated Sep. 22, 2017, PCT/CN2017/091397.

*Primary Examiner* — Jethro M. Pence

(57) ABSTRACT

A mask and an assembling method are provided. The mask includes a plurality of strip-shaped supporting structures; a mask sheet supported by adjacent supporting structures, having a mask pattern; and a frame having an opening area; each of the supporting structures includes an intermediate portion and extension portions at both ends of the supporting structure, a width of the intermediate portion is greater than a width of each of the extension portions; the frame is provided with a groove connected with the opening area; and the extension portions of the supporting structure and an transition area in the intermediate portion close to the extension portion are located in the groove, and a fixing (Continued)

point configured to fix the supporting structure with the groove is at least disposed in the transition area.

14 Claims, 6 Drawing Sheets

(51) Int. Cl.
    *H01L 51/00*           (2006.01)
    *H01L 51/56*           (2006.01)
    *C23C 14/12*          (2006.01)
    *B05C 21/00*          (2006.01)
(52) U.S. Cl.
    CPC .......... *C23C 14/24* (2013.01); *H01L 51/0011* (2013.01); *H01L 51/56* (2013.01)

(56) References Cited

FOREIGN PATENT DOCUMENTS

| | | |
|---|---|---|
| CN | 105586568 A | 5/2016 |
| CN | 106367718 A | 2/2017 |
| JP | 4439203 B2 | 3/2010 |

\* cited by examiner

MASK AND ASSEMBLING METHOD THEREOF

TECHNICAL FIELD

The embodiments of the present disclosure relate to a mask and an assembling method thereof.

BACKGROUND

Fine metal mask (FMM) technology is a method of evaporating a light-emitting material corresponding to each of pixels in an OLED (organic light-emitting display) device onto an array substrate of LTPS (low temperature poly silicon) type by an evaporation method according to a corresponding process. Red, green or blue light-emitting layer is evaporated to a corresponding pixel area by using a pattern (for example, a plurality of square-shaped slits or a plurality of strip-shaped slits) on a FMM sheet of the FMM.

As illustrated in FIG. 1 and FIG. 2, in the known FMM design, a cover in a longitudinal direction and a howling (not illustrated in the figure) in a horizontal direction for supporting the FMM sheet with a certain pattern are designed as a structure with greater width in the middle and smaller width at both ends, so as to reduce a width of a groove on a frame of the FMM for accommodating the supporting structure, thereby increasing a welding area (as illustrated in FIG. 1, denoted by reference numeral "a") between the FMM sheet and the frame, and ensuring a welding stability of the FMM sheet.

However, when both ends of the cover or the howling are welded into the groove of the frame, the cover or the howling needs to be stretched to a certain extent to be in a tension state during a welding process, and both sides of a middle portion with relatively greater width of the cover or the howling would be curled downward, which may affect the stability of the supporting structure for supporting the FMM sheet, and hence affect an evaporated pattern of the OLED product.

SUMMARY

In order to solve the above problems in the prior art, embodiments of the present disclosure provide a mask and an assembling method thereof, which can prevent a middle portion with relatively greater width of the supporting structure from being curled downward upon the supporting structure such as a cover or a howling being fixed on the frame, thereby stabilizing a contact state between the supporting structure and the mask sheet.

To achieve the above objective, the embodiments of the present disclosure adopt the following technical solutions.

In one aspect, an embodiment of the present disclosure provides a mask. The mask includes: a plurality of strip-shaped supporting structures, each of the supporting structures includes an intermediate portion and extension portions at both ends of the supporting structure, a width of the intermediate portion is greater than a width of each of the extension portions; a mask sheet supported by adjacent supporting structures, the mask sheet has a mask pattern; and a frame having an opening area. The frame is provided with a groove connected with the opening area; the extension portions at both ends of the supporting structure and an transition area in the intermediate portion close to the extension portion is located in the groove; and a fixing point configured to fix the supporting structure with the groove is at least disposed in the transition area.

In one embodiment, a plurality of fixing points is disposed in one transition area in a width direction of the supporting structure.

In one embodiment, the groove includes a first area and a second area connected with each other, a width of the first area is greater than a width of the second area in a width direction of the supporting structure; the first area is connected with the opening area; the transition area of the supporting structure is located in the first area, and the extension portions of the supporting structure are at least located in the second area.

In one embodiment, the mask further includes a cutting slot which is disposed in the groove in the width direction of the supporting structure and is located on a side of the fixing point away from the opening area.

In one embodiment, a length of the cutting slot is equal to a width of the first area in the width direction of the supporting structure.

In one embodiment, first areas of adjacent at least two grooves are connected.

In one embodiment, the mask further includes a cutting slot which is disposed in the first area in the width direction of the supporting structure and is located on a side of the fixing point away from the opening area, wherein cutting slots in adjacent at least two grooves are connected together.

In one embodiment, a length of the cutting slots connected together is equal to a width of the first areas connected together, in the width direction of the supporting structure.

In one embodiment, a width of the cutting slot is ranged from 0.1 mm to 1.0 mm, in a length direction of the supporting structure.

In one embodiment, two ends of the mask sheet are fixed on a part of the frame between adjacent two second areas by fixing points.

In one embodiment, the fixing point is further disposed on the extension portion.

In one embodiment, the frame includes an outer frame and an inner frame nested inside the outer frame, the inner frame is provided with the opening area; the groove is opened in the inner frame, and a surface of the inner frame provided with the groove is higher than the outer frame.

In another aspect, an embodiment of the present disclosure provides an assembling method of a mask. The mask includes: a plurality of strip-shaped supporting structures, a mask sheet having a mask pattern, and a frame having an opening area, each of the supporting structures includes an intermediate portion and extension portions at both ends of the supporting structure, a width of the intermediate portion is greater than a width of each of the extension portions, and the frame is provided with a groove connected with the opening area. The assembling method includes: fixing the supporting structure on the frame to stretch the supporting structure to be in a tension state such that the extension portions of the supporting structure and an transition area in the intermediate portion close to the extension portion are located in the groove and a fixing point configured to fix the supporting structure with the groove is at least disposed in the transition area; mounting the mask sheet on adjacent two supporting structures and fixing the mask sheet on a part of the frame between adjacent two grooves to stretch the mask sheet to be in a tension state.

In one embodiment, the supporting structure and the mask sheet are fixed on the frame by welding.

Based on this, in the above-mentioned masks provided by the embodiments of the present disclosure, the intermediate portion having greater width of the supporting structure is provided with the fixing point (for example, solder joint), and hence is less likely to be curled downward after the supporting structure is welded, so that the supporting stability of the supporting structure for supporting the mask sheet is barely affected, thereby ensuring a yield of evaporated patterns on OLED products.

BRIEF DESCRIPTION OF THE DRAWINGS

The embodiments of the present disclosure are described in more detail below with reference to the accompanying drawings so that those skilled in the art may understand the present disclosure more clearly, wherein.

DETAILED DESCRIPTION

Figure 1:
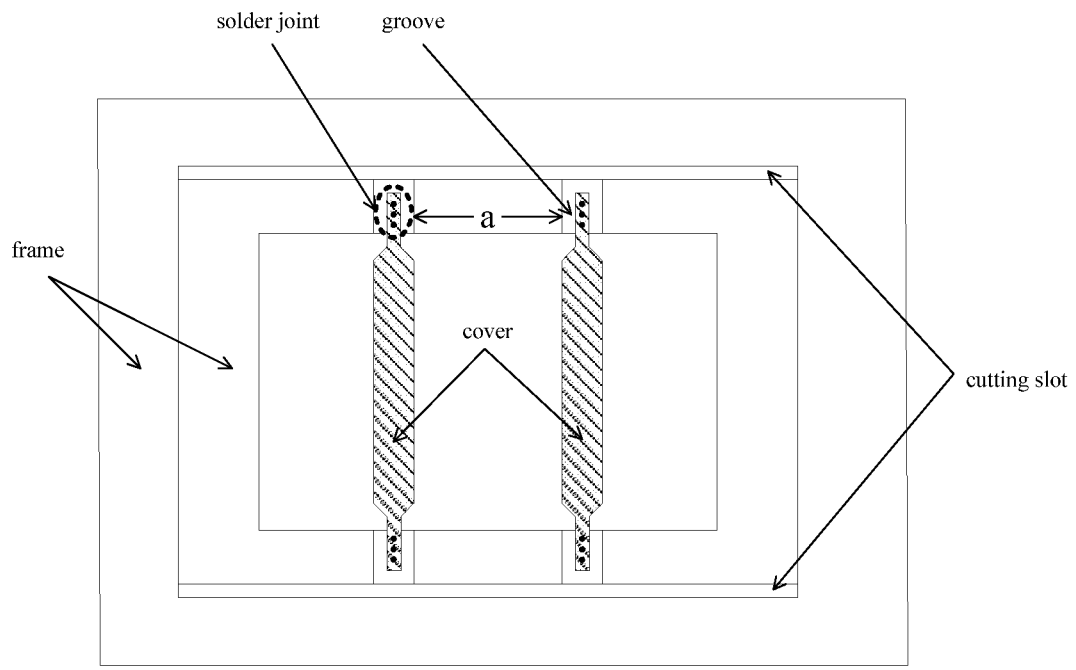
FIG. 1 is a top view illustrating a structure of a known mask in which a mask sheet is not welded.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An actual size of the mask pattern on the mask sheet in the mask according to the embodiments of the present disclosure is extremely small, thus all the structural dimensions in the drawings of the embodiments of the present disclosure are enlarged for clarity, and do not represent the actual scales.

As illustrated in FIG. 3 through FIG. 9, an embodiment of the present disclosure provides a mask 01, which includes a plurality of strip-shaped supporting structures 10 and mask sheets 20 supported by the plurality of strip-shaped supporting structures 10, each of the mask sheets has a mask pattern 201. Each of the supporting structures 10 includes an intermediate portion 101 and extension portions 102 at both ends of the supporting structure. A width of the intermediate portion 101 is greater than a width of each of the extension portions 102. The mask 01 can further include a frame 30 having an opening area 30a. The frame 30 is provided with a groove 31 connected with the opening area 30a; the extension portions 102 at both ends of the supporting structure 10 and transition areas 101a in the intermediate portion 101 close to the extension portions 102 are located in the groove 31, and a fixing point configured to fix the supporting structure 10 with the groove 31 is at least disposed in the transition areas 101a.

It should be noted that the strip-shaped supporting structure in the mask 01 provided by the embodiment of the present disclosure can be, for example, a cover longitudinally disposed or a howling horizontally disposed.

FIG. 3, FIG. 4 and FIG. 6 through FIG. 9 only schematically illustrate one mask sheet 20 supported by two covers disposed side by side in a longitudinal direction. However, the embodiments of the present disclosure are not limited thereto, and in the above described mask 01, the number of mask sheets 20 can be flexibly set according to the number of substrate to be evaporated and an area of the substrate to be patterned. For example, a plurality of mask sheets can be disposed in sequence on three or more covers.

Figure 8:
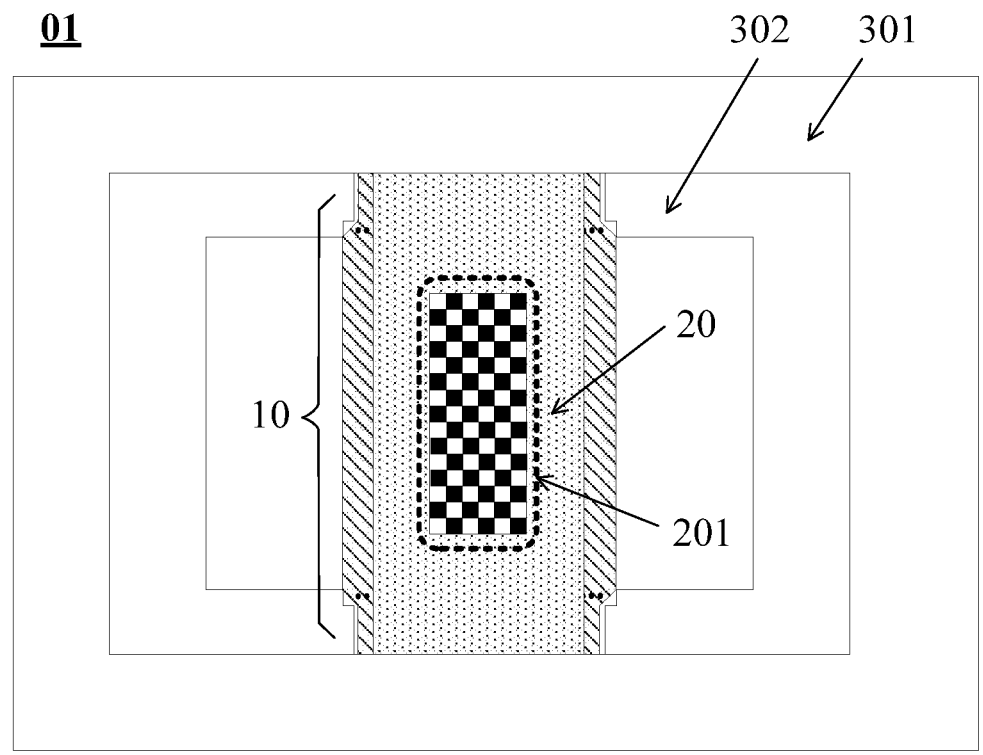
FIG. 8 is a top view illustrating a structure after fixing a mask sheet to the frame of the mask as illustrated in FIG. 6.
Figure 9:
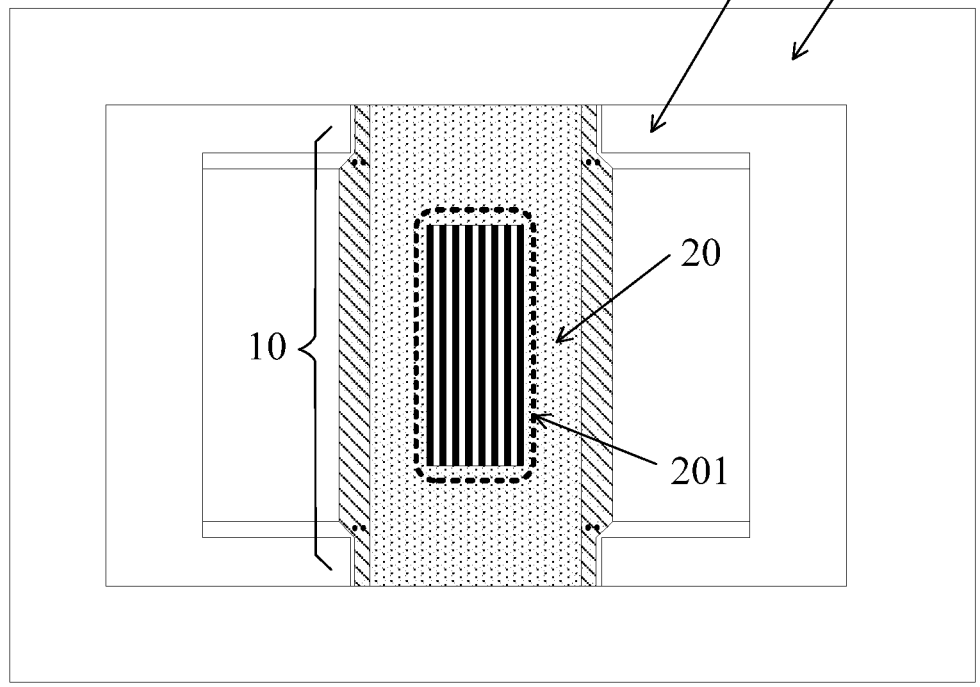
FIG. 9 is a top view illustrating a structure after fixing a mask sheet to the frame of the mask as illustrated in FIG. 7.

The mask pattern 201 on the mask sheet 20 can be, for example, a plurality of square-shaped slits (i.e., a mosaic pattern) as illustrated in FIG. 8 or a plurality of strip-shaped slits as illustrated in FIG. 9. As for the specific structure of the mask pattern, reference may be made to the known technology, and the embodiments of the present disclosure are merely illustrative but not limiting.

The supporting structure 10 is usually made of a metal, thus in order to facilitate the formation of the pattern of the supporting structure 10, as illustrated in FIG. 3, FIG. 4 and FIG. 6 through FIG. 9, a width of the transition area 101a of the intermediate portion 101 can be gradually decreased along a direction pointing to the extension portion 102.

In addition, the mask sheet 20 is mounted on the supporting structure 10 after being fixed to the frame by, for example, a solder joint, thus those skilled in the art should be appreciated that a depth of the groove 31 for accommodating the supporting structure 10 and a thickness of the supporting structure 10 should be as equal as possible. Considering the precision of machining, a reserved amount of 10 μm can be set. That is, the depth of the groove 31 is equal to the thickness of the supporting structure 10 plus 10 μm, so that the mask sheet 20 can be in contact with the frame for welding.

Based on this, in the above-mentioned mask provided by the embodiment of the present disclosure, the intermediate portion of the supporting structure having a relatively greater width is provided with a fixing point (for example, a solder joint) and hence is not prone to be curled downward after the supporting structure is welded, so that the supporting stability of the supporting structure for supporting the mask sheet is barely affected, thereby ensuring the yield of evaporated patterns on the OLED products.

Furthermore, in the known mask, the solder joint of the cover or the howling is provided only at two ends thereof, that is, the solder joint is only located in the whole area of the groove; as a result, when the mask needs to be repaired, it may be easy to damage a groove boundary upon a grinding stone polishing the solder joint, which will affect the stability and operation repeatability of a repair device to recognize the groove boundary when the FMM is repaired again. Therefore, according to the embodiments of the present disclosure, as illustrated in FIG. 3, FIG. 4 and FIG. 6 through FIG. 9, a plurality of fixing points 40 disposed in one transition area 101a can be disposed along the width direction of the supporting structure 10. That is, the fixing points 40 (for example, solder joints) are horizontally disposed so that a fixing state between the intermediate portion with a relatively greater width and the frame 30 becomes more firm without any downward curling of the intermediate portion, when the supporting structure 10 is welded to the groove 31. At the same time, the fixing points horizontally disposed are close to the opening area of the frame, that is, the fixing points are disposed at an inner edge of the frame; as a result, when the supporting structure is repaired, the groove boundary on the frame is not easily damaged upon a grinding stone polishing the solder join, thereby improving the stability and operation repeatability of the repair device for recognizing the groove boundary again.

For example, the fixing points 40 can be disposed in one row or in multiple rows. The fixing points 40 can be flexibly set according to the specific size of the supporting structure 10, which is not limited in the embodiments of the present disclosure.

Herein, when the fixing point 40 is only disposed in the transition area 101a, warping of the extension portion 102 may be occurred during operation because there is no fixing point on the extension portion 102 at both ends of the supporting structure 10, which may affect the stability of the supporting structure 10. Therefore, according to the embodiment of the present disclosure, the fixing point 40 for fixing the supporting structure 10 and the groove 31 can also be disposed on the extension portion 102 at the two ends of the supporting structure 10.

It should be noted that, a certain number of fixing points 40 have been provided on the intermediate portion 101 with relatively greater width, thus additional fixing points 40 disposed on the extension portions 102 would only bring about an effect of further stabilizing the supporting structure 10 without resulting in a problem of curling downward of the intermediate portion 101 with relatively greater width of the supporting structure.

Figure 5:
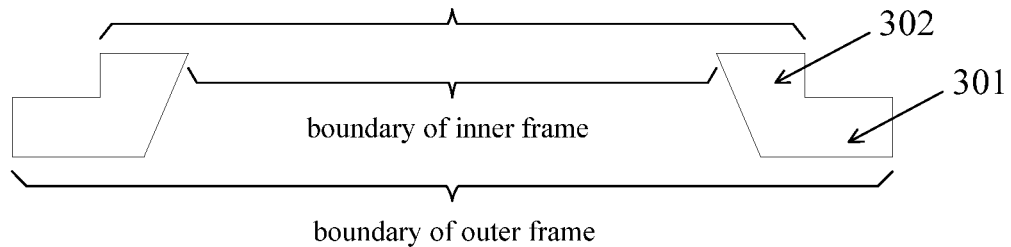
FIG. 5 is a cross-sectional structural diagram of a frame in a mask according to an embodiment of the present disclosure taken along AA' direction of FIG. 3.

Further, as illustrated in FIG. 5, the frame 30 can include an outer frame 301 and an inner frame 302 nested in the outer frame, the inner frame 302 has an opening area 30a. The outer frame and the inner frame can be, for example, an integral structure.

For example, the outer frame 301 is formed so as to be easily fixed into the evaporation chamber; the groove 31 is opened in the inner frame 302, and a surface of the inner frame 302 provided with the groove 31 is higher than the outer frame 301, that is, a stepped surface is formed to facilitate subsequent cutting and repair operations of the supporting structure 10.

Based on the above, a pattern of the groove 31 can include, but not limited to, the following two types.

Figure 6:
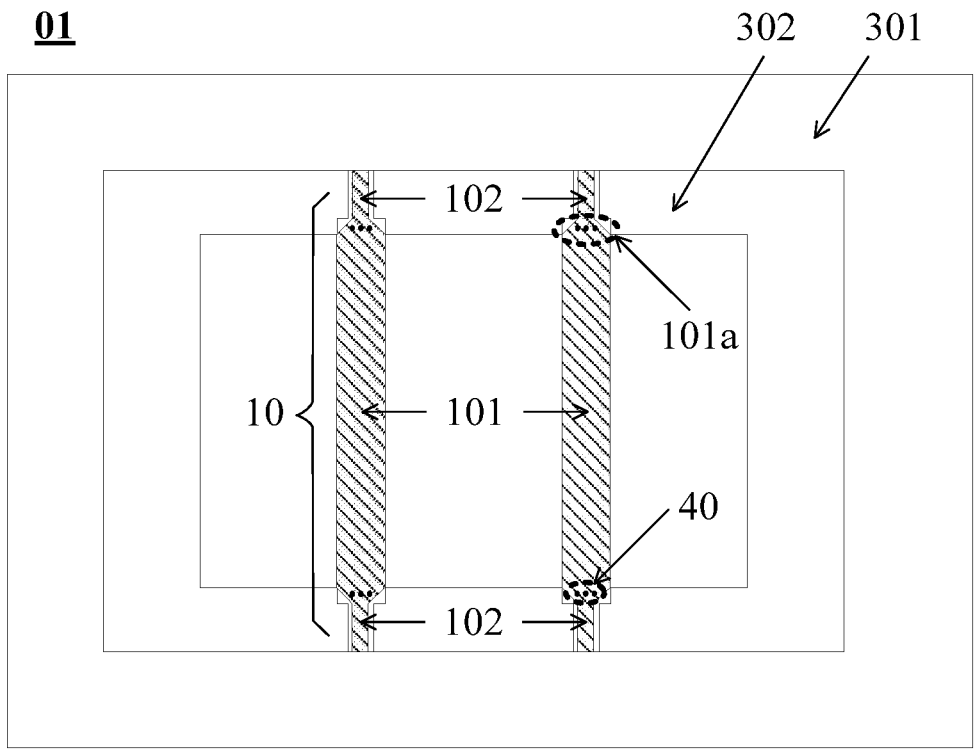
FIG. 6 is a top view illustrating a structure after fixing a supporting structure to the frame of the mask as illustrated in FIG. 3.

Regarding the first type, as illustrated in FIG. 6, the groove 31 can include a first area 31a and a second area 31b connected with each other. Along the width direction of the supporting structure 10, a width of the first area 31a is greater than a width of the second area 31b. The first area 31a is connected with the opening area 30a. The transition area 101a of the supporting structure 10 is located in the first area 31a; and the extension portion 102 of the supporting structure 10 is at least located in the second area 31b.

That is to say, a shape of the groove 31 is similar to a shape of "T", in a top view. Referring to FIG. 8, both ends of the mask sheet 20 can be fixed on a part of the frame 30 between the two second areas by fixing points (for example, solder joints). Because the second area 31b of the groove 31 far away from the opening area 30a is in the shape of a vertical bar, when the supporting structure 10 is repaired, damages caused by the grinding stone to the edge of the vertical part (i.e., the second area 31b) of the groove can be avoided. And at the same time, the welding area for fixing the mask sheet 20 with the frame 30 is extended to the left side and the right side, thereby improving the fitness between the mask 01 and the substrate to be evaporated, and reducing evaporation defects.

Figure 7:
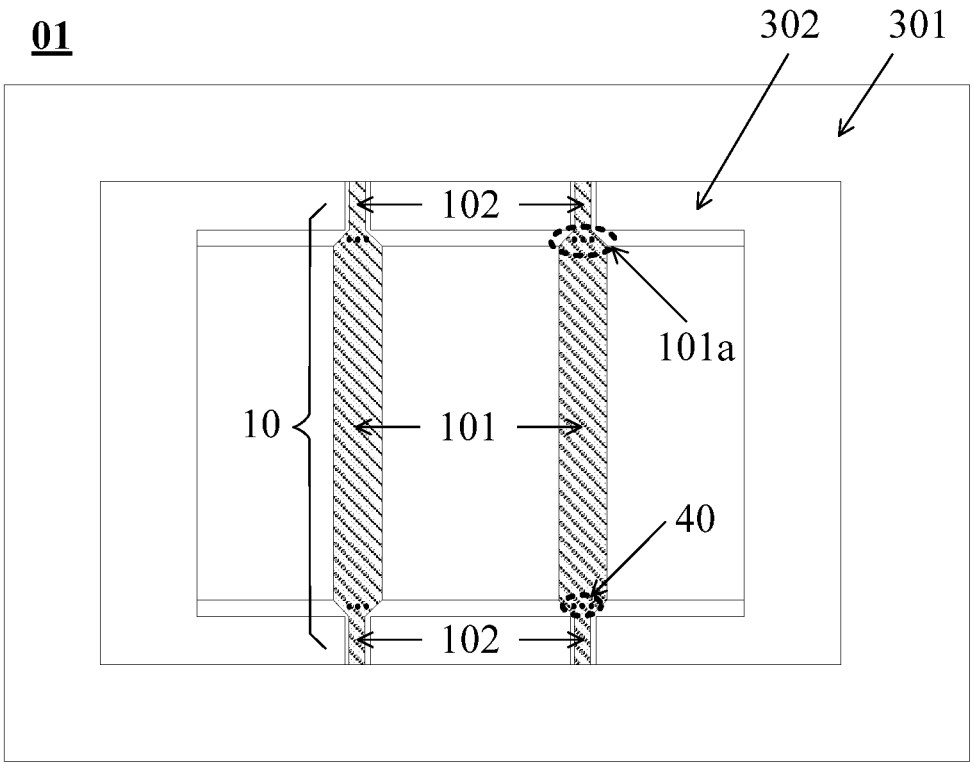
FIG. 7 is a top view illustrating a structure after fixing a supporting structure to the frame of the mask as illustrated in FIG. 4.

Regarding the second type, as illustrated in FIG. 7, the groove 31 includes a first area 31a and a second area 31b connected with each other. A width of the first area 31a is greater than a width of the second area 31b, in the width direction of the supporting structure 10. First areas 31a of adjacent at least two grooves 31 are connected together. The first area 31a is connected with the opening area 30a, the transition area 101a of the supporting structure 10 is located in the first area 31a, and the extension portion 102 of the supporting structure 10 is at least located in the second area 31b.

That is, the grooves 31 on both sides of the opening area 30a are integrally connected with each other. As illustrated in FIG. 9, both ends of the mask sheet 20 can be fixed on a part of the frame 30 between two adjacent second areas by fixing dots (for example, solder joints). Because the second area 31b of the groove 31 far away from the opening area 30a is in a shape of a vertical bar, damages caused by the grinding stone to the edge of the vertical part of the groove (i.e., the second area 31b) can be avoided when the supporting structure 10 is repaired. At the same time, the welding area for fixing the mask sheet 20 with the frame 30 is extended to both sides, thereby improving the fitness between the mask 01 and the substrate to be evaporated, and reducing evaporation defects.

Figure 10:
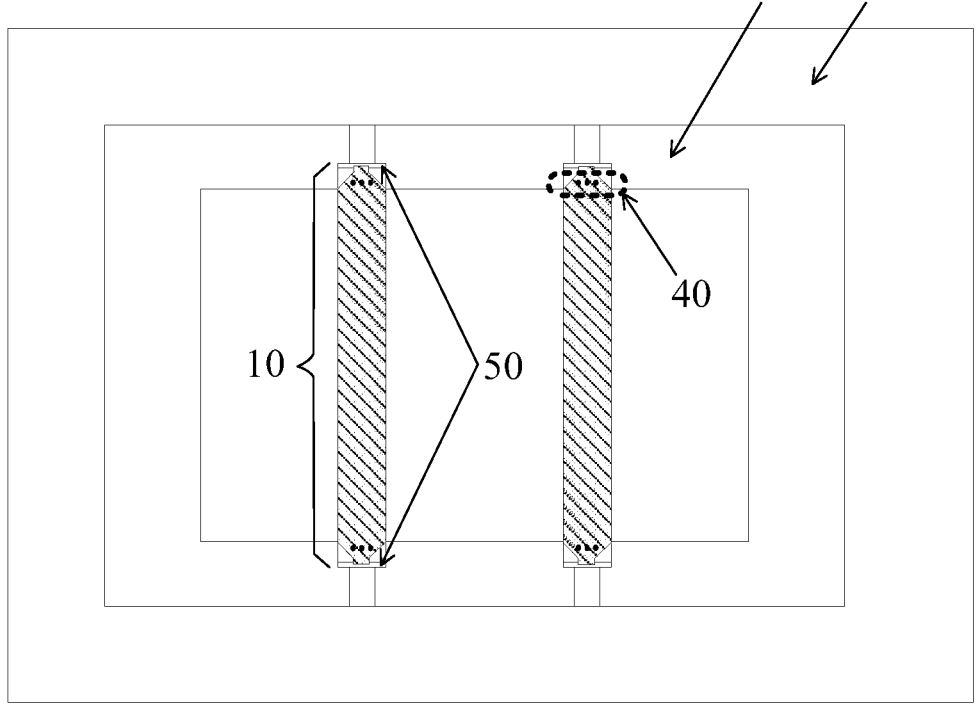
FIG. 10 is a top view illustrating a structure of the supporting structure in the mask as illustrated in FIG. 6 after being cut.
Figure 11:
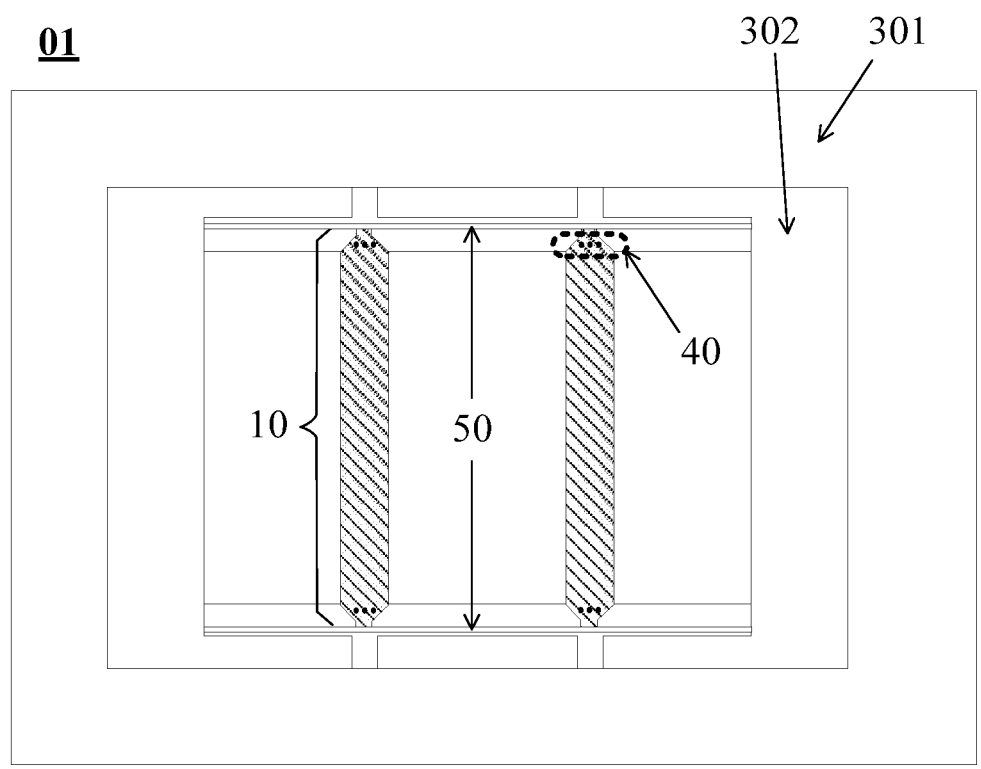
FIG. 11 is a top view illustrating a structure of the supporting structure in the mask as illustrated in FIG. 7 after being cut.

Further, because the extension portions at both two ends of every supporting structure, upon formation, are generally connected together, in order to facilitate the cutting of the extension portions at both ends of the supporting structure, as illustrated in FIG. 10 and FIG. 11, the above-mentioned mask 01 provided by the embodiments of the present disclosure further includes a cutting slot 50 disposed in the groove 31 along the width direction of the supporting structure 10. Because the cutting slot 50 is formed in an area which is further dented into the groove 31, a certain cutting allowance can be provided for cutting the extension portions at both ends of the supporting structure to make the cutting operation more convenient. For example, the cutting slot 50 is located on a side of the fixing point 40 far away from the opening area 30a. A width of the cutting slot 50 along a length direction of the supporting structure 10 can be ranged from 0.1 mm to 1.0 mm, so that a cutting blade 50 can be inserted into the cutting slot 50 during cutting off the extension portions which are connected, for example, the width of the cutting slot 50 can be 0.5 mm.

Figure 2:
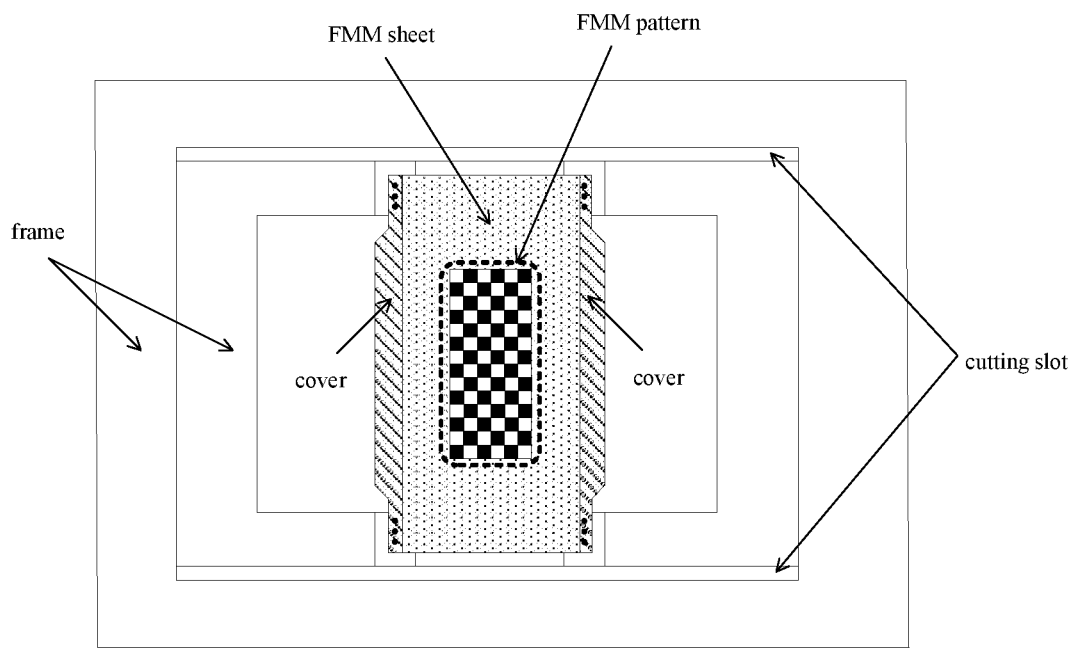
FIG. 2 is a top view illustrating a structure of a known mask after the mask sheet is welded.
Figure 3:
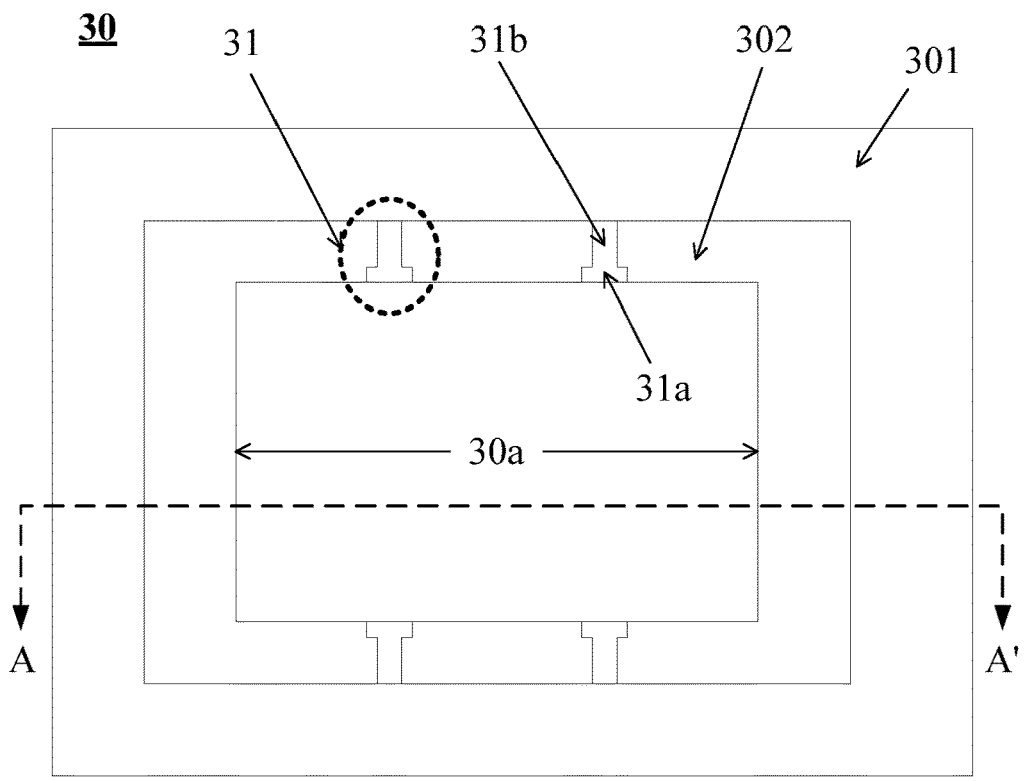
FIG. 3 is a first top view illustrating a structure of a frame in a mask according to an embodiment of the present disclosure.
Figure 4:
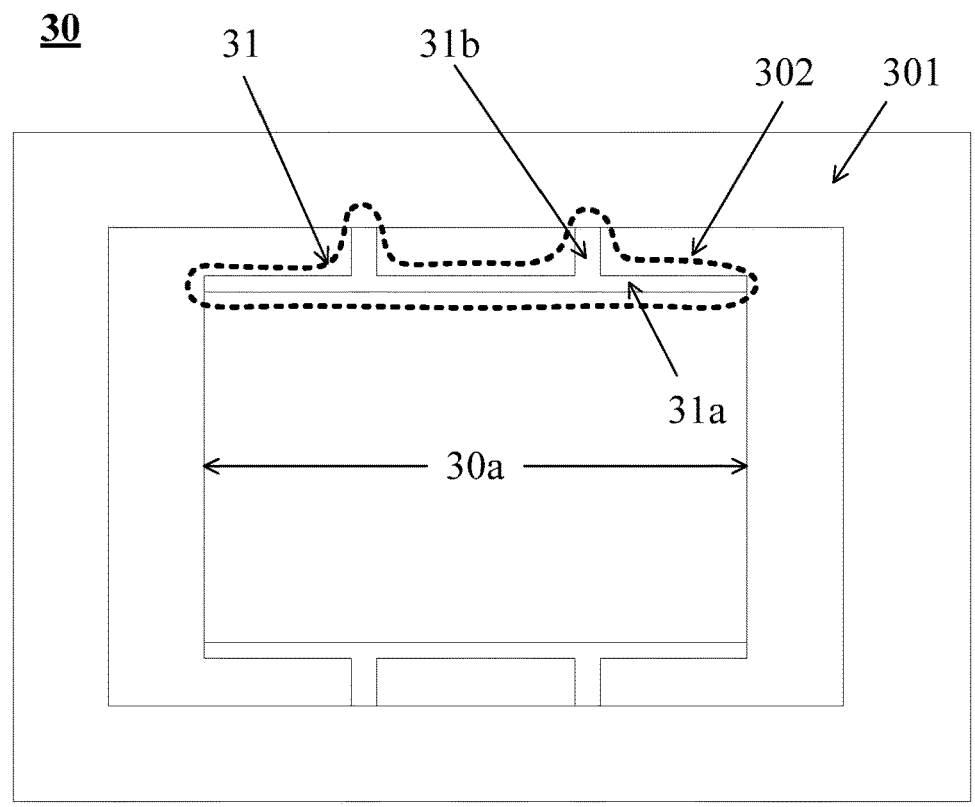
FIG. 4 is a second top view illustrating a structure of a frame in a mask according to an embodiment of the present disclosure.

In this way, as compared with the cutting slot disposed at an outer edge of the opening area of the frame in the known mask as illustrated in FIGS. 1 and 2, the embodiment of the present disclosure provides the cutting slot 50 in the mask 01 at an inner edge of the opening area 30a of the frame 30 to reduce the occupation of the effective area of the frame so that the welding area for fixing the mask sheet 20 with the frame 30 is extended towards the upper and lower sides of the opening area 30a far way from the opening area 30a, which further improves the fitness between the above-mentioned mask 01 and the substrate to be evaporated, and reduces evaporation defects.

For example, in the case where the pattern of the groove 31 is in a form of a plurality of independent and non-connected English letters "T" as illustrated in FIG. 6, along the width direction of the supporting structure 10, a length of the cutting slot 50 disposed in the groove 31 is equal to a width of the first area 31a, as illustrated in FIG. 10.

For another example, in the case where the grooves 31 on both sides of every opening area 30a are connected with each other to constitute an integral as illustrated in FIG. 7, the cutting slots 50 in at least two connected grooves 31 are connected together, and along the width direction of the supporting structure 10, a length of the cutting slots 50 that are connected together is equal to a width of the first areas 31a which are connected together, as illustrated in FIG. 11.

Based on the same inventive concept, an embodiment of the present disclosure further provides an assembling method of a mask 01, which includes:

Step (1), as illustrated in FIG. 6 or FIG. 7, fixing (for example, fixing by welding) the supporting structure 10 on the frame 30 and stretching the supporting structure 10 to be in a tension state. The extension portions 102 at both ends of the supporting structure 10 and an transition area 101a in the intermediate portion 101 close to the extension portion 102 are located in the groove, and a fixing point 40 (e.g., solder joint, in case of welding) configured to fix the supporting structure 10 with the groove is at least disposed in the transition area;

Step (2), as illustrated in FIG. 8 or FIG. 9, mounting the mask sheet 20 on adjacent two supporting structures 10 and fixing the mask sheet 20 on a part of the frame 30 between adjacent two grooves to stretch the mask sheet 20 to be in a tension state.

Obviously, those skilled in the art can make various modifications and variations to the present disclosure without departing from the spirit and scope of the invention. In this way, if these modifications and variations fall within the scope of the claims of the invention or the equivalent technologies thereof, the invention is also intended to include these modifications and variations.

The application claims priority to the Chinese patent application No. 201611104015.8, filed Dec. 5, 2016, the entire disclosure of which is incorporated herein by reference as part of the present application.

The invention claimed is:

1. A mask comprising:
    a plurality of strip-shaped supporting structures, each of the supporting structures comprising a continuously formed intermediate portion having a flat surface, extension portions at both ends of the supporting structure, and a transition area connecting the intermediate portion and the extension portions, a width of the entire intermediate portion being uniform and greater than a width of each of the extension portions, a width of the transition area being between the width of the intermediate portion and the width of each of the extension portions and being gradually reduced towards the extensions portions;
    a mask sheet supported by adjacent supporting structures, the mask sheet having a mask pattern; and
    a frame having an opening area;
    wherein the frame is provided with a groove connected with the opening area;
    wherein the extension portions at both ends of the supporting structure and the transition area close to the extension portions are located in the groove, and a fixing point configured to fix the supporting structure with the groove is at least disposed in the transition area,
    wherein the groove comprises a first area and a second area connected with each other, wherein
    a width of the first area is greater than a width of the second area, in a width direction of the supporting structure;
    the first area is connected with the opening area;
    the transition area of the supporting structure is located in the first area, and the extension portions of the supporting structure are at least located in the second area; and
    a cutting slot is disposed in the groove along a width direction of the supporting structure, and the cutting slot is formed to be further dented into the groove.

2. The mask according to claim 1, wherein a plurality of fixing points is disposed in the transition area in a width direction of the supporting structure.

3. The mask according to claim 1,
    a wherein the cutting slot is located on a side of the fixing point far away from the opening area.

4. The mask according to claim 3, wherein a width of the cutting slot is ranged from 0.1 mm to 1.0 mm, in a length direction of the supporting structure.

5. The mask according to claim 3, wherein a length of the cutting slot is equal to a width of the first area, in the width direction of the supporting structure.

6. The mask according to claim 1, wherein first areas of adjacent at least two grooves are connected together.

7. The mask according to claim 6, further comprising
    a cutting slot disposed in the first area in the width direction of the supporting structure and located on a side of the fixing point far away from the opening area, wherein cutting slots in adjacent at least two grooves are connected together.

8. The mask according to claim 7, wherein a length of the cutting slots connected together is equal to a width of the first areas connected together, in the width direction of the supporting structure.

9. The mask according to claim 7, wherein a width of the cutting slot is ranged from 0.1 mm to 1.0 mm, in a length direction of the supporting structure.

10. The mask according to claim 1, wherein two ends of the mask sheet are fixed on a part of the frame between adjacent two second areas by fixing points.

11. The mask according to claim 1, wherein the fixing point is further disposed on the extension portion.

12. The mask according to claim 1, wherein the frame comprises an outer frame and an inner frame nested inside the outer frame, the inner frame is provided with the opening area;

the groove is opened in the inner frame, and a surface of the inner frame provided with the groove is higher than the outer frame.

13. An assembling method of a mask, the mask comprising:
a plurality of strip-shaped supporting structures, each of the supporting structures comprising a continuously formed intermediate portion having a flat surface, extension portions at both ends of the supporting structure, and a transition area connecting the intermediate portion and the extension portions, a width of the entire intermediate portion being uniform and greater than a width of each of the extension portions, a width of the transition area being between the width of the intermediate portion and the width of each of the extension portions and being gradually reduced towards the extensions portions;
a mask sheet supported by adjacent supporting structures, the mask sheet having a mask pattern, and
a frame having an opening area;
wherein the frame is provided with a groove connected with the opening area;
wherein the groove comprises a first area and a second area connected with each other, wherein a width of the first area is greater than a width of the second area, in a width direction of the supporting structure;
the first area is connected with the opening area;
the transition area of the supporting structure is located in the first area, and the extension portions of the supporting structure are at least located in the second area; and
a cutting slot is disposed in the groove along a width direction of the supporting structure, and the cutting slot is formed to be further dented into the groove;
the assembling method comprising:
fixing the supporting structure on the frame to stretch the supporting structure to be in a tension state such that the extension portions at both ends of the supporting structure and the transition area close to the extension portions are located in the groove, and a fixing point configured to fix the supporting structure with the groove being at least disposed in the transition area; and
mounting the mask sheet on adjacent two supporting structures and fixing the mask sheet on a part of the frame between adjacent two grooves to stretch the mask sheet to be in a tension state.

14. The assembling method according to claim 13, wherein the supporting structure and the mask sheet are fixed on the frame by welding.

* * * * *